United States Patent [19]
Chung et al.

[11] Patent Number: 6,048,737
[45] Date of Patent: *Apr. 11, 2000

[54] METHOD FOR FABRICATING A FERROELECTRIC CAPACITOR

[75] Inventors: Il-sub Chung, Seoul; In-kyung Yoo, Kyungki-do; Chi-won Chung, Seoul, all of Rep. of Korea; Seshu B. Desu, Blacksburg, Va.

[73] Assignee: Samsung Electronics Co., Ltd., Kyungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/707,033

[22] Filed: Sep. 3, 1996

Related U.S. Application Data

[62] Division of application No. 08/535,881, Sep. 28, 1995.

[30]     Foreign Application Priority Data

Sep. 30, 1994 [KR] Rep. of Korea ................... 94-25193
Jan. 28, 1995 [KR] Rep. of Korea ................... 95-1804

[51] Int. Cl.[7] .................................................... H01L 21/00
[52] U.S. Cl. ........................................ 438/3; 438/240

[58] Field of Search ........................... 438/3, 240, 396, 438/238, 239, 253, 254, 397

[56]               References Cited

U.S. PATENT DOCUMENTS

| | | | |
|---|---|---|---|
| 5,005,102 | 4/1991 | Larson | 361/313 |
| 5,142,437 | 8/1992 | Kammerdiner et al. | 361/313 |
| 5,254,217 | 10/1993 | Maniar et al. | 156/656 |
| 5,471,363 | 11/1995 | Mihara | 361/305 |
| 5,491,102 | 2/1996 | Desu et al. | 437/52 |
| 5,519,235 | 5/1996 | Ramesh | 257/295 |
| 5,555,486 | 9/1996 | Kingon et al. | 361/305 |

*Primary Examiner*—Joni Chang
*Attorney, Agent, or Firm*—Eugene M. Lee, Esq.; Kile, McIntyre, Harbin & Lee

[57]                ABSTRACT

A ferroelectric capacitor taking a multilayer structure wherein a conductive oxide layer which is formed between a metal electrode and a ferroelectric layer, capable of enhancing the fatigue behavior in addition to reducing the leakage current. The multilayer structure can be fabricated by depositing a silicon oxide ($SiO_2$) layer, an adhesive layer, a bottom metal layer, a lower conductive oxide layer, a ferroelectric layer, an upper conductive oxide layer and a top metal electrode layer are deposited over a silicon substrate, in sequence.

22 Claims, 7 Drawing Sheets

METHOD FOR FABRICATING A FERROELECTRIC CAPACITOR

This is a divisional of copending application Ser. No. 08/535,881 filed on Sep. 28, 1995.

BACKGROUND OF THE INVENTION

1. Field of the Invention

The present invention relates, in general, to a ferroelectric capacitor and, more particularly, to an improvement in fatigue and leakage current along with the ferroelectric capacitor. Also, the present invention is concerned with a method for fabricating the same.

2. Description of the Prior Art

For ferroelectric capacitor, an electrode with superior conductivity is necessary to transfer charges. Typically, metal electrodes or conductive oxide electrodes have been employed in ferroelectric capacitors. As for metal electrodes, illustrative are a platinum electrode and a platinum/titanium electrode. They are enough only for the purpose of conductivity. However, they are disadvantageous in that the electrical properties of the ferroelectric capacitors comprising only the metal electrodes become degraded as follows. Oxygen vacancies are accumulated at an interface between the ferroelectric and the metal electrode, leading to formation of space charge region at the interface. Since such space charge region has a characteristic of linear capacitor, the dielectric properties of the capacitor are determined by the space charge rather than by the ferroelectric. This causes a rapid fatigue which results from the polarization reversion of ferroelectric, degrading the electrical properties.

In order to prevent the formation of space charge region attributable to the accumulation of oxygen vacancy, there have been suggested to replace Pt electrode with conductive oxide electrode. A $RuO_2$ electrode, representative of the conductive oxide electrodes, was reported to be able to improve the fatigue somewhat because of supplying oxygen to interface region. However, there appears a significant increase of leakage current compared to that of the metal electrode. This is believed to be attributed to a fact that defect states present at the interface between the ferroelectric and the conductive oxide metal lower the barrier height of electron or that, upon forming PZT, Ru metal from $RuO_2$ would diffuse and react with PbO at the grain boundary of PZT to form a conductive lead ruthenate ($PbRuO_{3-x}$), which results in a reduction of electrical resistance in the ferroelectric thin film. Besides, the conductive oxide electrodes are of lower polarization than metal electrodes as well as of high coercive field. Thus, capacitor adopting only conductive oxide electrodes seems to be difficult to apply for memory devices.

SUMMARY OF THE INVENTION

Therefore, it is a principal object of the present invention to overcome the problems encountered in prior arts and to provide a ferroelectric capacitor, capable of improving the fatigue behavior in addition to reducing the leakage current.

It is another object of the present invention to provide a method for fabricating the ferroelectric capacitor.

Based on the intensive and thorough study by the present inventors, the above objects could be accomplished by a provision of a ferroelectric capacitor taking a multilayer structure wherein a thin conductive oxide layer which is formed between a metal electrode and a ferroelectric layer.

In accordance with another aspect of the present invention, there is provided a method comprising the steps of forming a separate thin $SiO_2$ layer on a silicon substrate 1; depositing a metal upon the $SiO_2$ layer, to form an adhesive layer for enhancing adhesion of a metal layer to the $SiO_2$ layer; depositing a metal upon the adhesive layer, to form a bottom metal electrode; depositing a conductive oxide upon the bottom metal electrode, to form a lower subelectrode layer with a predetermined thickness; depositing a ferroelectric material upon the lower subelectrode layer, to form a ferroelectric layer; depositing a conductive oxide upon the ferroelectric layer, to form an upper subelectrode layer with a predetermined thickness, said conductive oxide being the same as that for the lower subelectrode layer; and depositing a metal upon the upper subelectrode layer, to form a top metal electrode, said metal being the same as that for the bottom metal electrode.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

In accordance with the present invention, a thin oxide layer is formed between a ferroelectric and a metal electrode, with the aim of preventing the fatigue in addition to improving the leakage current property in a ferroelectric capacitor. Advantage is taken of thin oxide layer to absorb the oxygen vacancies which are diffused from the ferroelectric and to reduce its leakage current. Since the ferroelectric is nucleated upon the thin film layer, the crystallinity and growth behavior of the ferroelectric are controlled by the conditions for depositing the thin oxide film. Accordingly, the present ferroelectric capacitor undertakes a structure in which its electrical properties are dominantly determined by the oxide layer.

The application of the preferred embodiments of the present invention is best understood with reference to the accompanying drawings, wherein like reference numerals are used for like and corresponding parts, respectively.

Figure 1:
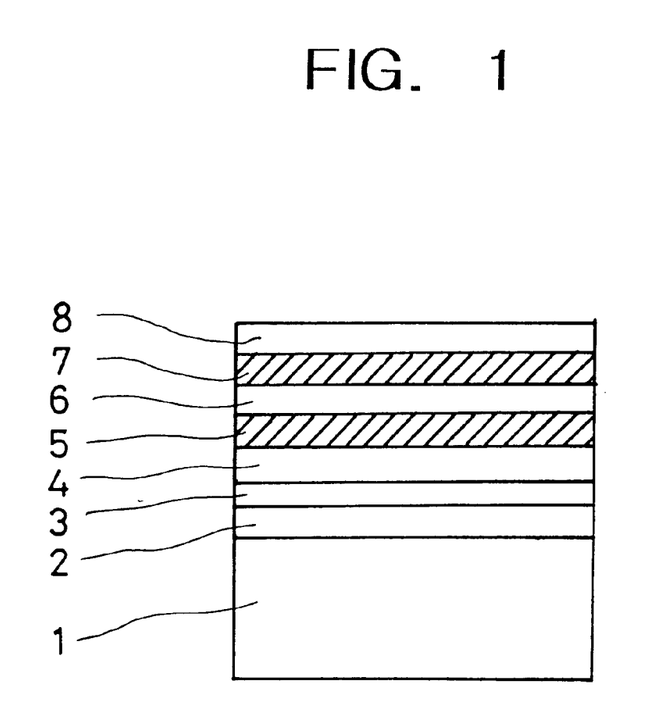
FIG. 1 is a schematic cross sectional view showing a multilayer structure of ferroelectric capacitor, according to the present invention.

Referring to FIG. 1, there is shown a ferroelectric capacitor according to a first embodiment of the present invention. As shown in this figure, the ferroelectric capacitor has a multilayer structure wherein, over a silicon substrate 1, a silicon oxide ($SiO_2$) layer 2, an adhesive layer 3, a bottom metal layer 4, a lower conductive oxide layer 5, a ferroelectric layer 6, an upper conductive oxide layer 7 and a top metal electrode layer 8 are deposited, in sequence. In contrast with the conventional ferroelectric capacitors, the present ferroelectric capacitor takes such a structure that both metal electrodes and conductive oxide electrodes coexist, in order to combine the advantages of the respective electrodes.

As mentioned above, because the crystallinity and growth property of the ferroelectric are dependent upon the deposition conditions of the conductive oxide layers, these layers control the electrical properties of the resulting ferroelectric capacitor with such multilayer structure. Of course, the conductive oxide layers play a role in absorbing the diffusion of oxygen vacancy, thereby improving the electrical properties like fatigue.

Following are of requisites for the conductive oxide layer: first, it has excellent capability of absorbing the oxygen vacancies from the ferroelectric; and they should be not voluminous so that they transfer the charges from the ferroelectric to the metal without any loss. Therefore, it is formed as thinly as possible provided that defect on its surface is minimally maintained. The thickness of the conductive oxide layer is preferably on the order of about 30 to about 70 nm.

As for material for the conductive oxide layer, an oxide is selected from a group consisting of $RuO_{2-x}$, $IrO_{2-x}$ and $RhO_{2-x}$. Preferred oxides include $RuO_2$, $IrO_2$ and $RhO_2$. $RuO_{2-x}$ is known as a material showing a significant effect of oxygen vacancy absorption.

FIG. 2 shows the preferred steps of fabricating the ferroelectric capacitor of FIG. 1. These steps will be in detail described in connection with FIGS. 2A through 2E.

Figure 2A:
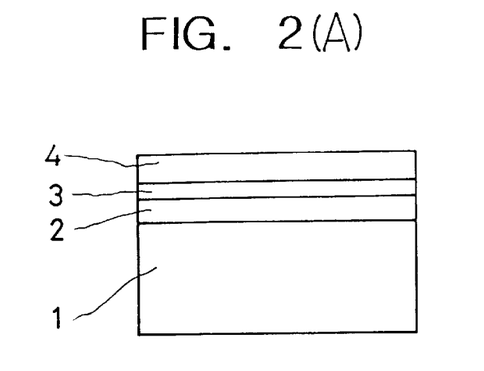
FIG. 2A through 2E are schematic cross sectional views showing a method for fabricating the ferroelectric capacitor of FIG. 1.

First, as shown in FIG. 2A, a separate thin $SiO_2$ layer 2 is formed on a Si substrate 1, followed by sequential deposition of an adhesive layer 3 and a bottom metal electrode 4 over the $SiO_2$ layer 2. adhesive layer 3 is to enhance the adhesion of bottom metal electrode layer 4 to $SiO_2$ layer 2 and preferably made of titanium. Platinum is used for bottom metal electrode layer 4 because of its superior electroconductivity and leakage current characteristics. An ordinary annealing process may be carried out when bottom metal electrode layer 4 is deposited. However, it is preferred that bottom metal electrode layer 4 is subjected to the annealing process, along with an oxide layer to be formed at further step, because there is obtained an effect that the contact between the bottom electrode layer and the oxide layer might be much improved.

Figure 2B:
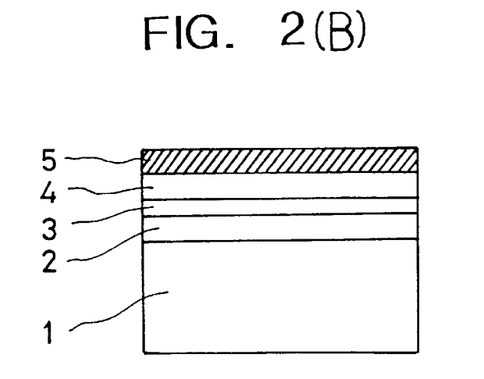

With reference to FIG. 2B, a lower oxide layer 5 is thinly deposited over bottom metal electrode layer 4, using a sputtering or metal-organic chemical vapor deposition (MOCVD) process. As previously mentioned, lower oxide layer 5 is thin enough to transfer the charges but thick so as to generate defects on its surface as little as possible. Preferred is a range of from about 30 to about 70 nm. It is made of a conductive material selected from a group consisting of $RuO_{2-x}$, $IrO_{2-x}$ and $RhO_{2-x}$ and preferred is that x is zero.

An oxidative atmosphere comprising a proper mixture of oxygen and an inert gas, such as nitrogen or argon, is useful to reduce the defect on surface, when the conductive oxide layer is subjected to annealing. In the case that the metal electrode layer is not thermally treated before formation of the conductive oxide layer, the oxygen in the oxidative atmosphere preferably ranges in partial pressure from about 20 to about 40 mole % and more preferably from about 20 to about 30 mole %. For example, if the partial pressure of oxygen is over 40 mole %, the conductive oxide layer is cracked although the nucleation of the ferroelectric on the conductive oxide layer is not largely affected. On the other hand, if the partial pressure is below 20 mole %, the conductive oxide layer cannot obtain a composition capable of absorbing the oxygen vacancies.

Figure 2C:
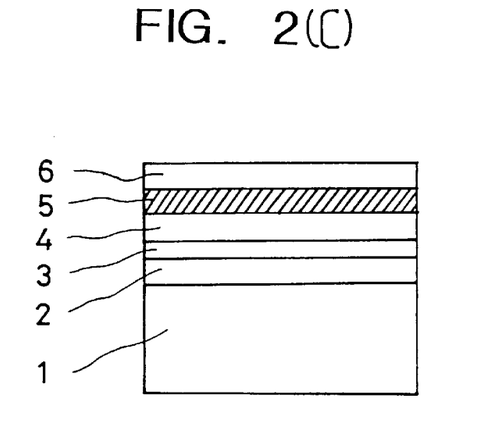

With reference to FIG. 2C, a ferroelectric layer 6 with a thickness of about 200 to about 300 nm is deposited over lower oxide layer 5.

Figure 2D:
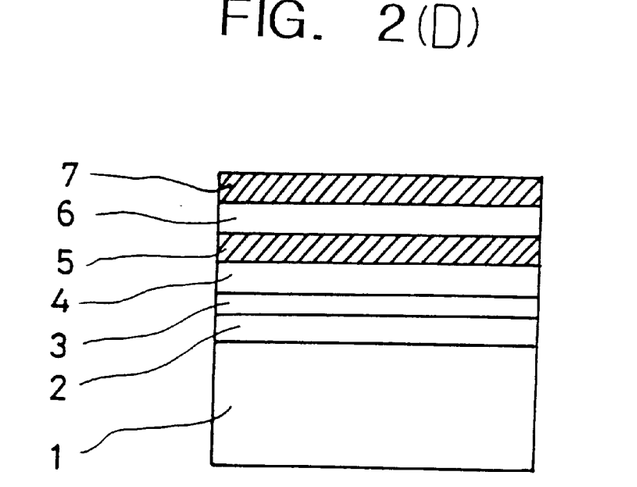

With reference to FIG. 2D, a top oxide layer 7 is deposited over ferroelectric layer 6, using a sputtering or MOCVD process. Like the lower oxide layer, the top oxide layer is made of a conductive material selected from a group consisting of $RuO_{2-x}$, $IrO_{2-x}$ and $RhO_{2-x}$ and the thickness is on the order of about 30 to about 70 nm.

Figure 2E:
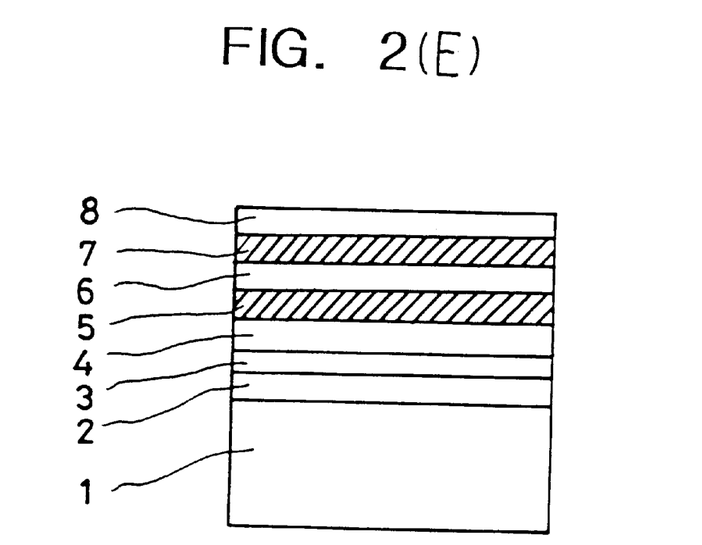

Finally, with reference to FIG. 2E, a top metal electrode layer 8 is deposited over top oxide layer 7.

A better understanding of the present method may be obtained in light of following examples which are set forth to illustrate, and are not to be construed to limit, the present invention.

EXAMPLE I

Using a chemical vapor deposition process, a $SiO_2$ layer about 200 nm thick was formed over a silicon substrate.

For metal deposition, a metal was deposited about 100 mm apart from the target at a pressure of about 10 mTorr, using a sputtering process with a power of about 300 W. In the metal deposition, main variables were a temperature during deposition ($T_s$) and an annealing temperature after deposition ($T_a$) Under the conditions, a titanium layer with a thickness of about 20 nm was deposited upon the $SiO_2$ layer, followed by deposition of a 200 nm thick platinum layer upon the titanium layer.

After completion of depositing the bottom metal electrode layer, $RuO_2$ was deposited by use of a reactive sputtering process at a temperature of about 300° C. under an oxidative atmosphere in which the atomic ratio of an oxygen gas to an argon gas was 4:1, so as to form a conductive oxide layer about 30 nm thick. Thereafter, the conductive oxide layer was annealed at about 600° C. for about one hour in such an oxygen atmosphere that the conductive oxide layer might have a desirable composition.

Using a MOCVD process or a Sol-Gel process, PZT was deposited upon the conductive oxide layer, to form a ferroelectric layer about 250 nm thick.

For another conductive oxide layer about 30 nm thick, the process illustrated just above was repeated.

Finally, Pt was deposited in the same way as in the metal deposition, so as to form a top metal electrode.

EXAMPLE II $RuO_2$ was adopted as conductive oxide layer, with metal electrode of platinum. Using a direct current magnetron sputtering process, platinum was deposited over a $SiO_2$ layer coated upon a silicon substrate, to form a bottom metal electrode. This sputtering process was carried out at an output power of 300 W and at a pressure of 10 mTorr under the condition that the metal was 100 mm apart from the substrate and $T_s$. was about 200° C. Just after forming the metal electrode about 200 nm thick, no annealing process was undertaken. $RuO_2$ was deposited in a thickness of about 50 nm upon the platinum layer under an oxidative atmosphere containing an oxygen gas with a partial pressure of about 20 mole %. Subsequently, an annealing process was carried out at about 550° C. for 30 minutes, to stabilize the composition of $RuO_2$. PZT was spin-coated in a thickness of 300 nm upon the RuO$_2$ layer and then, annealed at about 600° C. for about 60 minutes. Upon this PZT layer, a RuO$_2$ layer was deposited under the same manners and conditions as those in the above one. Finally, a top metal electrode of platinum was formed over this RuO$_2$ in the same manners and conditions as those in the bottom metal electrode.

EXAMPLE III

Example 2 was repeated except that the oxygen partial pressure was about 40 mole % and no platinum electrodes were deposited.

The obtained ferroelectric capacitors were tested for fatigue using a pulse of 1 MHz. There was observed no fatigue in them until about $10^{11}$ cycles.

A leakage current of as little as about $7 \times 10^{-10}$ was shown in the obtained ferroelectric capacitors, which is much improved relative to a conventional one employing only RuO$_2$ ($1 \times 10^{-8}$ A).

Accordingly, the present invention is advantageous in that the fatigue which is generated when employing only Pt electrodes and the leakage current property which is aggravated when employing only RuO$_2$ electrodes can be improved both.

Figure 3:
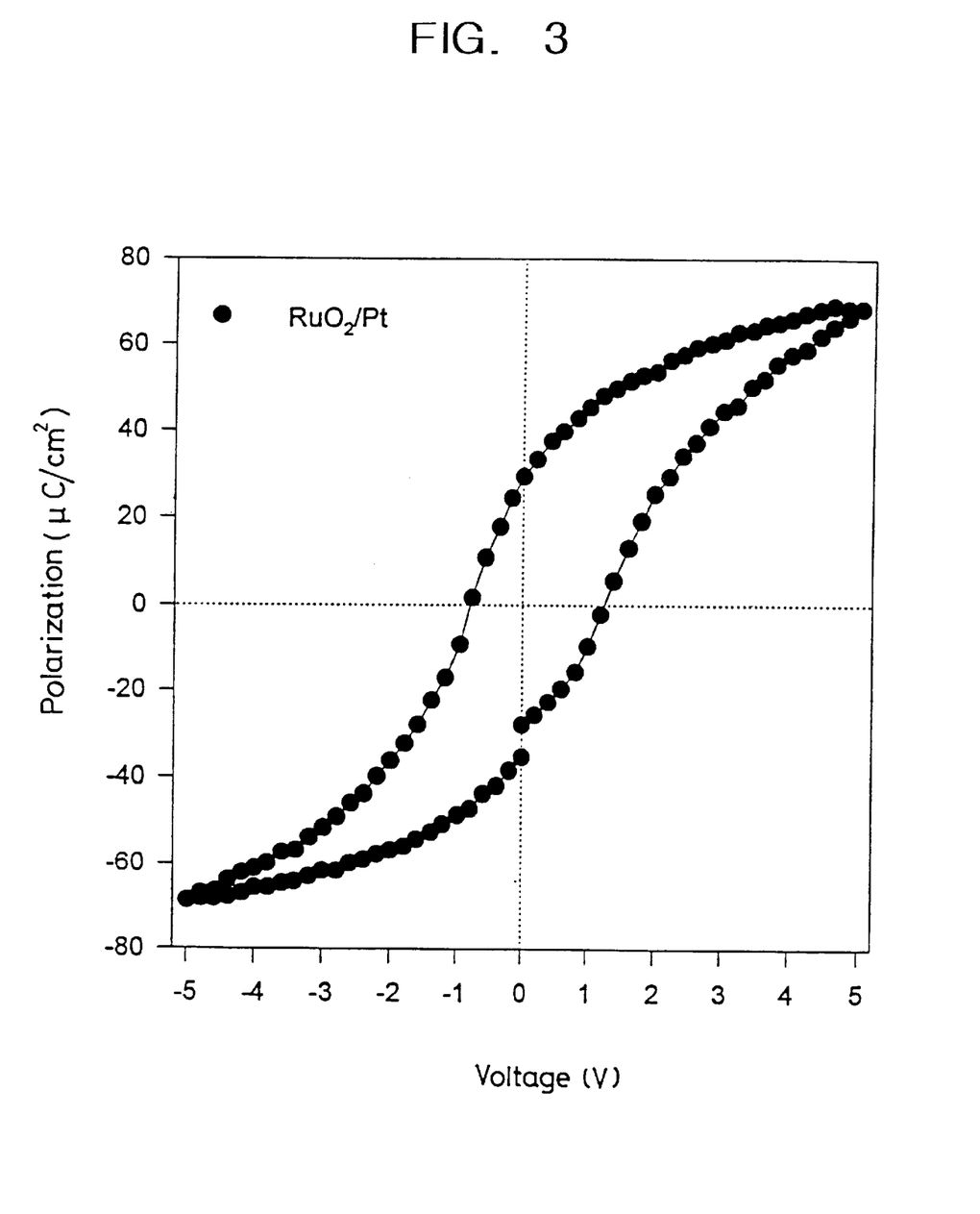
FIG. 3 is a hysteresis loop for a ferroelectric capacitor according to an embodiment of the present invention.

Referring to FIG. 3, there is a hysteresis loop for the ferroelectric capacitor obtained in Example 2. As shown in FIG. 3, this hysteresis is of more regular square shape than those of the ferroelectric capacitors comprising either platinum electrodes or RuO$_2$ electrodes. larger remanent polarization ($P_r$) and less coercive field ($E_c$) were observed.

Figure 4:
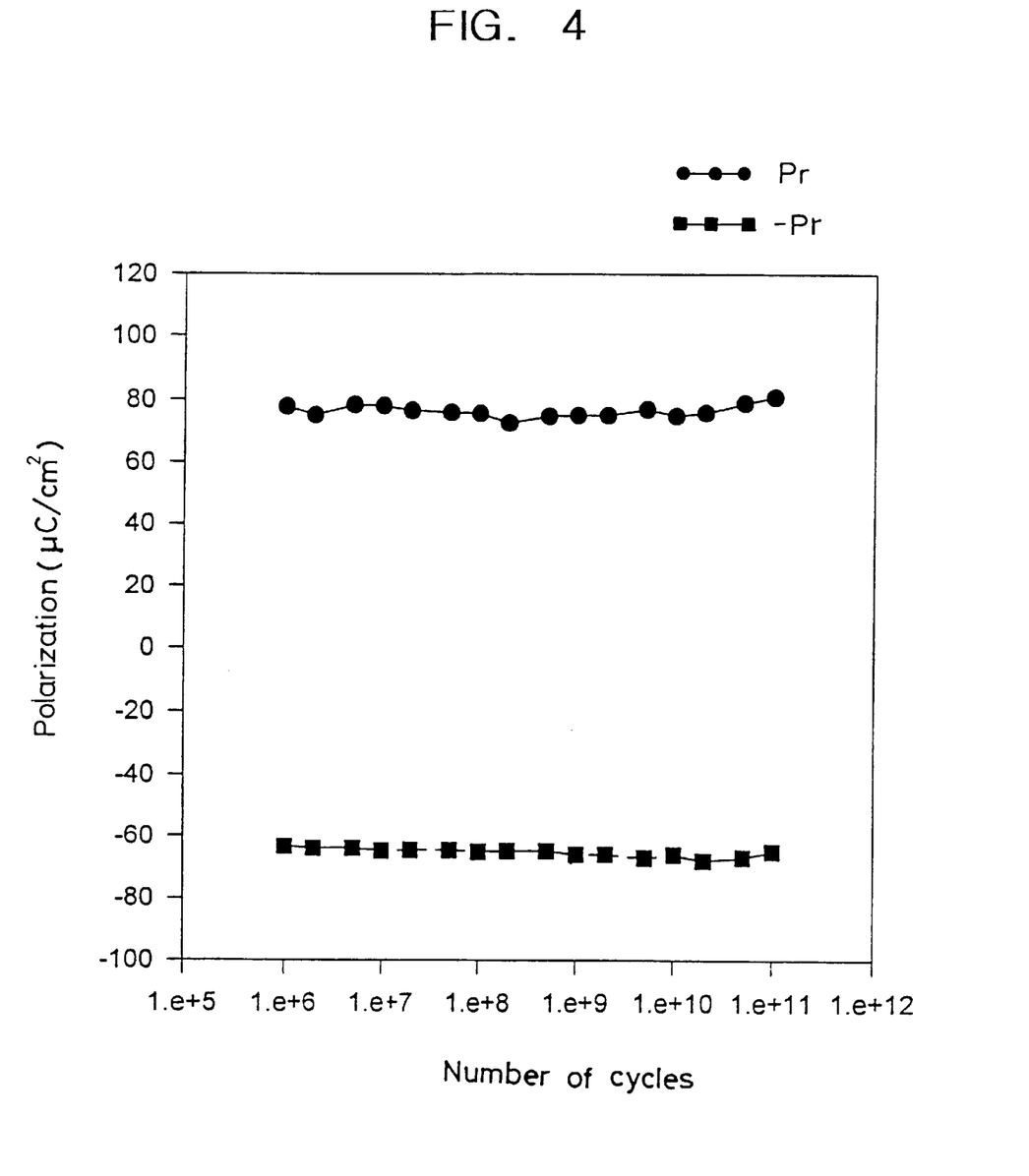
FIG. 4 is a graph showing a fatigue characteristic of a ferroelectric capacitor according to an embodiment of the present invention.

With reference to FIG. 4, there is a graph showing a fatigue characteristic of the ferroelectric capacitor obtained in Example 2. As shown in this graph, it is revealed that endurance cycle is significantly improved to a degree that fatigue does not appear until about $10^{11}$ cycles.

The ferroelectric capacitor of Example 2 was subjected to current-voltage test and exhibited a leakage current of $10^{-9}$ A at an input voltage of 5V with a leakage current per unit area of $4 \times 10^{-6}$ A/cm$^2$.

Figure 5:
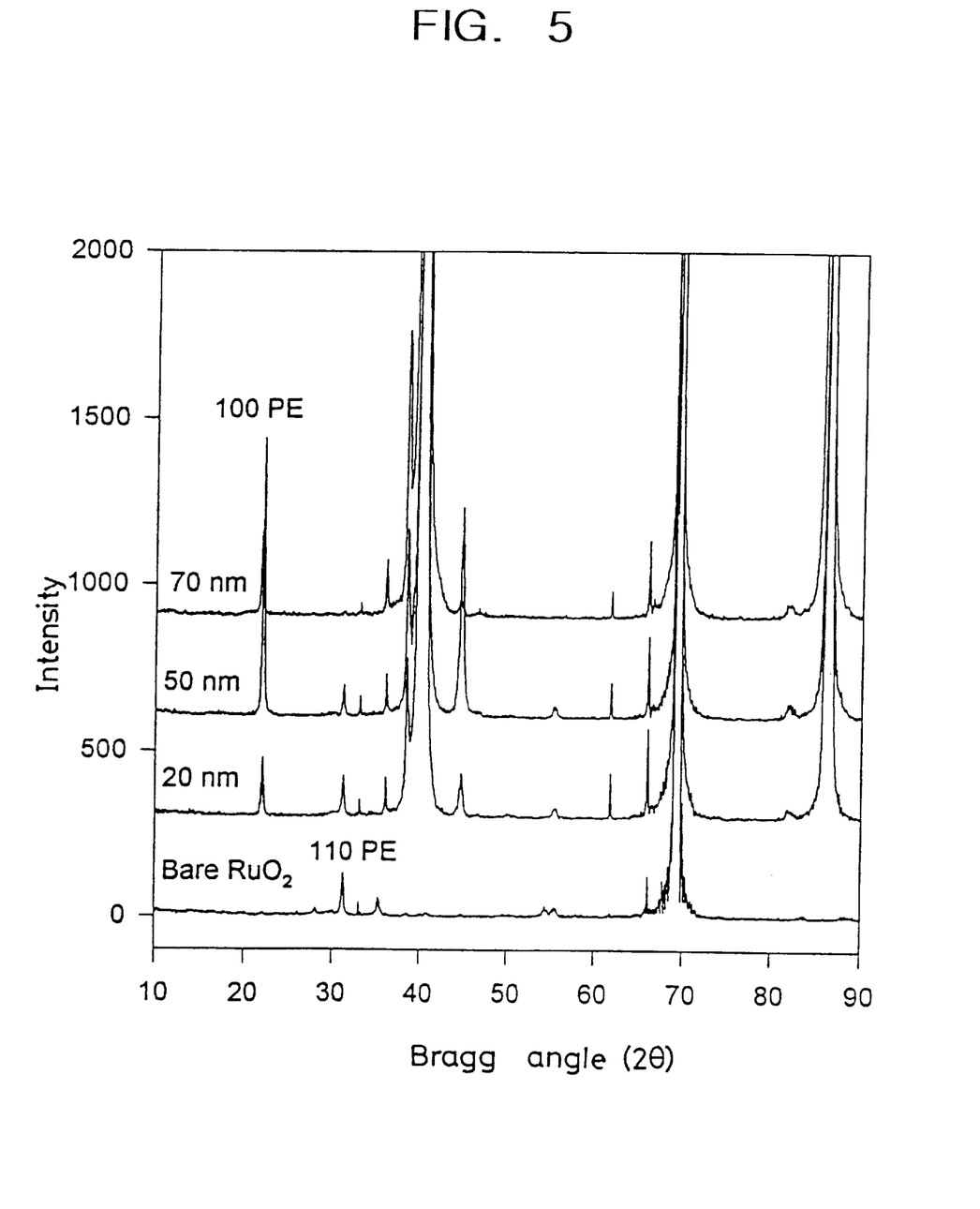
FIG. 5 is an X-ray diffraction pattern for a ferroelectric capacitor according to an embodiment of the present invention.
Figure 6:
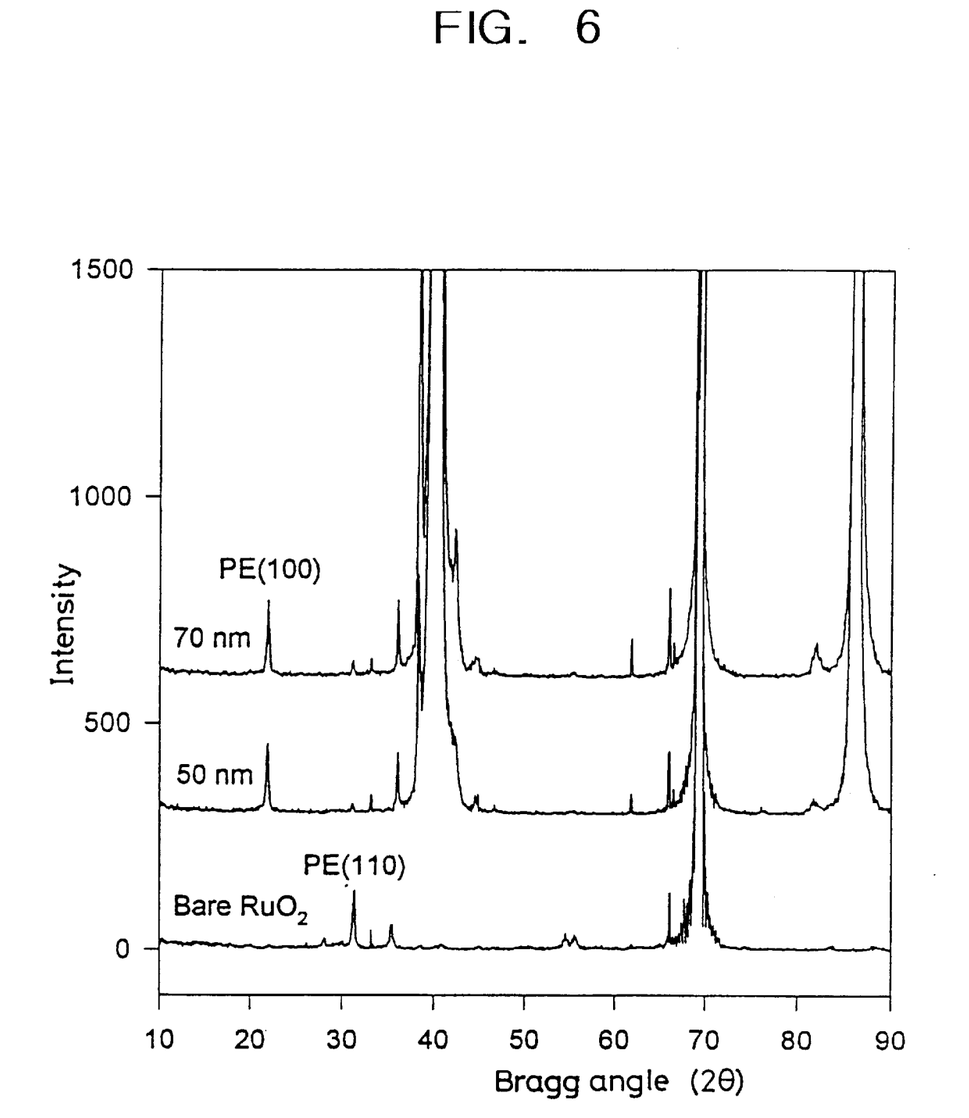
FIG. 6 is an X-ray diffraction pattern for a conventional ferroelectric capacitor.

A test for the nucleation of ferroelectric layer according to the formation and growth conditions of the oxide layer was executed by X-ray diffraction. Referring to FIGS. 5 and 6, there are shown X-ray diffraction patterns for the ferroelectric capacitors obtained in Examples 2 and 3, respectively. As shown in these figures, while the PZT nucleated on RuO$_2$/Pt has a major of (100) face and a minor of (110) face, the PZT of Example 3, defective of Pt layer, has a dominance of (110) growth face. It turned out that the partial pressure of oxygen when forming RuO$_2$ did not have large influence upon the nucleation of PZT film. However, an excess of oxygen (40 mole % or more) makes the RuO$_2$ layer cracked, to which PZT film is difficult to form owing. Accordingly, it is preferred that the oxidative atmosphere necessary for RuO$_2$ contains an oxygen partial pressure of from about 20 to about 30 mole %.

As apparent from the examples, the multilayer-structured ferroelectric capacitors according to the present invention not only significantly overcome the problem of fatigue which is serious in the conventional ferroelectric capacitor comprising only platinum electrodes, but improve the leakage current property of the conventional one which comprises only RuO$_2$ electrodes. In addition, the present composite electrode is superior to both conventional RuO$_2$ electrode and platinum electrode in hysteresis property, remanent polarization and coercive field.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the fabrication of a ferroelectric capacitor, comprising the sequential steps of:

forming a SiO$_2$ layer over a silicon substrate;

depositing a first metal adhesive layer over the SiO$_2$ layer to enhance adhesion of a metal electrode layer to the SiO$_2$ layer;

depositing a second metal electrode layer upon the first metal adhesive layer, to form a bottom metal electrode layer;

depositing a conductive oxide upon the bottom metal electrode layer, to form a lower subelectrode layer, without first annealing the bottom metal electrode layer;

annealing said lower subelectrode layer and bottom metal electrode layer together;

depositing a ferroelectric material upon the lower subelectrode layer, to form a ferroelectric layer after the step of annealing the lower subelectrode layer;

annealing the ferroelectric material deposited on the lower subelectrode layer;

depositing a second conductive oxide upon the ferroelectric layer, to form an upper subelectrode layer; and depositing a third metal layer upon the upper subelectrode layer, to form a top metal electrode layer.

2. A method in accordance with claim 1, wherein said adhesive layer is made of titanium.

3. A method in accordance with claim 1, wherein both said bottom and top metal electrodes are made of platinum.

4. A method in accordance with claim 1, wherein both said lower and upper subelectrode layers are made of a conductive oxide selected from the group consisting of RuO$_{2-x}$, IrO$_{2-x}$ and RhO$_{2-x}$.

5. A method in accordance with claim 1, wherein both said lower and upper subelectrode layers are deposited by a sputtering process or a metal-organic chemical vapor deposition process.

6. A method in accordance with claim 1, wherein each of the lower and upper subelectrode layers has a thickness ranging from about 30 to about 70 nm.

7. A method in accordance with claim 1, wherein the second conductive oxide is the same as the first conductive oxide.

8. A method in accordance with claim 1, wherein the third metal electrode layer forming the top metal electrode layer is the same as the second metal electrode layer forming the bottom metal electrode layer.

9. A method in accordance with claim 1, wherein said annealing step is carried out in an oxidative atmosphere.

10. A method in accordance with claim 9, wherein said oxidative atmosphere contains an oxygen gas with a partial pressure of from about 20 to about 40 mole %.

11. A method in accordance with claim 10, wherein said oxidative atmosphere contains an oxygen gas with a partial pressure of from about 20 to about 30 mole %.

12. A method for the fabrication of a ferroelectric capacitor, comprising the sequential steps of:

forming a SiO$_2$ layer over a silicon substrate;

depositing a first metal electrode layer over the SiO$_2$ layer, to form a bottom metal electrode layer;

depositing a first conductive oxide upon the bottom metal electrode layer, to form a lower subelectrode layer, without first annealing the bottom metal electrode layer;

annealing the lower subelectrode layer and the bottom metal electrode layer together;

depositing a ferroelectric material upon the lower subelectrode layer, to form a ferroelectric layer; and forming a second electrode over the ferroelectric layer.

13. A method in accordance with claim 12, wherein the annealing step is carried out in an oxidative atmosphere.

14. A method in accordance with claim 13, wherein the oxidative atmosphere contains an oxygen gas with a partial pressure of from about 20 to about 40 mole %.

15. A method in accordance with claim 14, wherein the oxidative atmosphere contains an oxygen as with a partial pressure of from about 20 to about 30 mole %.

16. A method in accordance with claim 12, wherein the second electrode is formed over the ferroelectric layer by:

depositing a second conductive oxide over the ferroelectric layer, to form an upper subelectrode layer; and depositing a second metal electrode layer over the upper subelectrode layer, to form a top metal electrode layer.

17. A method in accordance with claim 16, wherein both the bottom and top metal electrode layers are made of platinum.

18. A method in accordance with claim 16, wherein both the lower and upper subelectrode layers are made of a conductive oxide selected from the group consisting of $RuO_{2-x}$, $IrO_{2-x}$ and $RhO_{2-x}$.

19. A method in accordance with claim 16, wherein both the lower and upper subelectrode layers are deposited by use of a sputtering process or a metal-organic chemical vapor deposition process.

20. A method in accordance with claim 16, wherein each of the lower and upper subelectrode layers has a thickness ranging from about 30 to about 70 nm.

21. A method in accordance with claim 16, wherein the second conductive oxide is the same as the first conductive oxide.

22. A method in accordance with claim 16, wherein the second metal electrode layer forming the top metal electrode layer is the same as the first metal electrode layer forming the bottom metal electrode layer.

* * * * *